United States Patent
Ashikhmin et al.

(10) Patent No.: US 7,251,769 B2
(45) Date of Patent: Jul. 31, 2007

(54) METHODS AND APPARATUS FOR COMMUNICATION USING GENERALIZED LOW DENSITY PARITY CHECK CODES

(75) Inventors: Alexei Ashikhmin, Morristown, NJ (US); Gerhard Guenter Theodor Kramer, Bedminster, NJ (US); Stephan Ten Brink, Irvine, CA (US)

(73) Assignee: Lucent Technologies Inc., Murray Hill, NJ (US)

( * ) Notice: Subject to any disclaimer, the term of this patent is extended or adjusted under 35 U.S.C. 154(b) by 506 days.

(21) Appl. No.: 10/802,515

(22) Filed: Mar. 17, 2004

(65) Prior Publication Data

US 2005/0210367 A1  Sep. 22, 2005

(51) Int. Cl.
*H03M 13/29* (2006.01)
*H03M 13/45* (2006.01)

(52) U.S. Cl. ..................... 714/755; 714/780

(58) Field of Classification Search ............. 714/752, 714/755, 780
See application file for complete search history.

(56) References Cited

U.S. PATENT DOCUMENTS 4,295,218 A * 10/1981 Tanner ................. 714/762

OTHER PUBLICATIONS

Chung, S. et al., "On the Design of Low Density Parity-Check Codes within 0.0045 dB of the Shannon Limit", IEEE Communications Leters, vol. 5, No. 2, Feb. 2001, pp. 58-60.*

Yeo, E., et al., "VLSI Architectures for Iterative Decoders in Magnetic Recording Channels", IEEE .Transactions on Magnetics, vol. 37, No. 2, Mar. 2001, pp. 748-755.* ten Brink, S., "Convergence Behavior of Iteratively Decoded Parallel Concatenated Codes", IEEE Transactions on Communications, vol. 49, No. 10, Oct. 2001, pp. 1727-1737.*

Yeo, E., et al., "High Throughput Low-Density Parity-Check Decoder Architectures", IEEE Globecom '01, Nov. 2001, pp. 3019-3024.* ten Brink, S., et al., "Design of Low-Density Parity Check Codes for Multi-Antenna Modulation and Detection", submitted to IEEE Transactions on Communications, Jun. 2002, pp. 1-8.* ten Brink, s., et al., "Design of Repeat-Accumulate Codes for Iterative Detection and Decoding", IEEE Transactions on Signal Processing, vol. 51, No. 11, Nov. 2003, pp. 2764-2772.*

Ratzer, E., "Intersected Low-Density Parity-Check and Convolutional Codes"; Postgraduate Research Conference in Electronics, Photonics, Communications and Software, 5 pages, Apr. 2002.*

Franceschini, M., et al., "EXIT Chart-based Design of LDPC Codes for Inter-Symbol Interference Channels", 14th IST Mobile & Wireless Communications Summit, Jun. 2005, 5 pages.*

Ngatched et al., "Efficient Decoding of Generalized Low-Density Parity-Check Codes Based on Long Component Codes", WCNC 2003, Mar. 2003, pp. 705-710.*

* cited by examiner

Primary Examiner—Stephen M. Baker

(57) ABSTRACT

Techniques and systems for design and use of generalized LDPC codes. A generalized LDPC code comprises a set of codewords producing valid results when submitted to a validator comprising a set of variable nodes and a set of check nodes, with outputs of the variable nodes being connected to inputs of the check nodes by interleaver edges. Each check node and variable node is in the form of a code, with the output of a node being valid if its inputs form a valid codeword. An extrinsic information transfer function (EXIT) chart is used to form a check node curve and a variable node curve is matched to the check node curve. The variable nodes are then constructed so as to provide the information transfer properties indicated by the variable node curve.

12 Claims, 6 Drawing Sheets

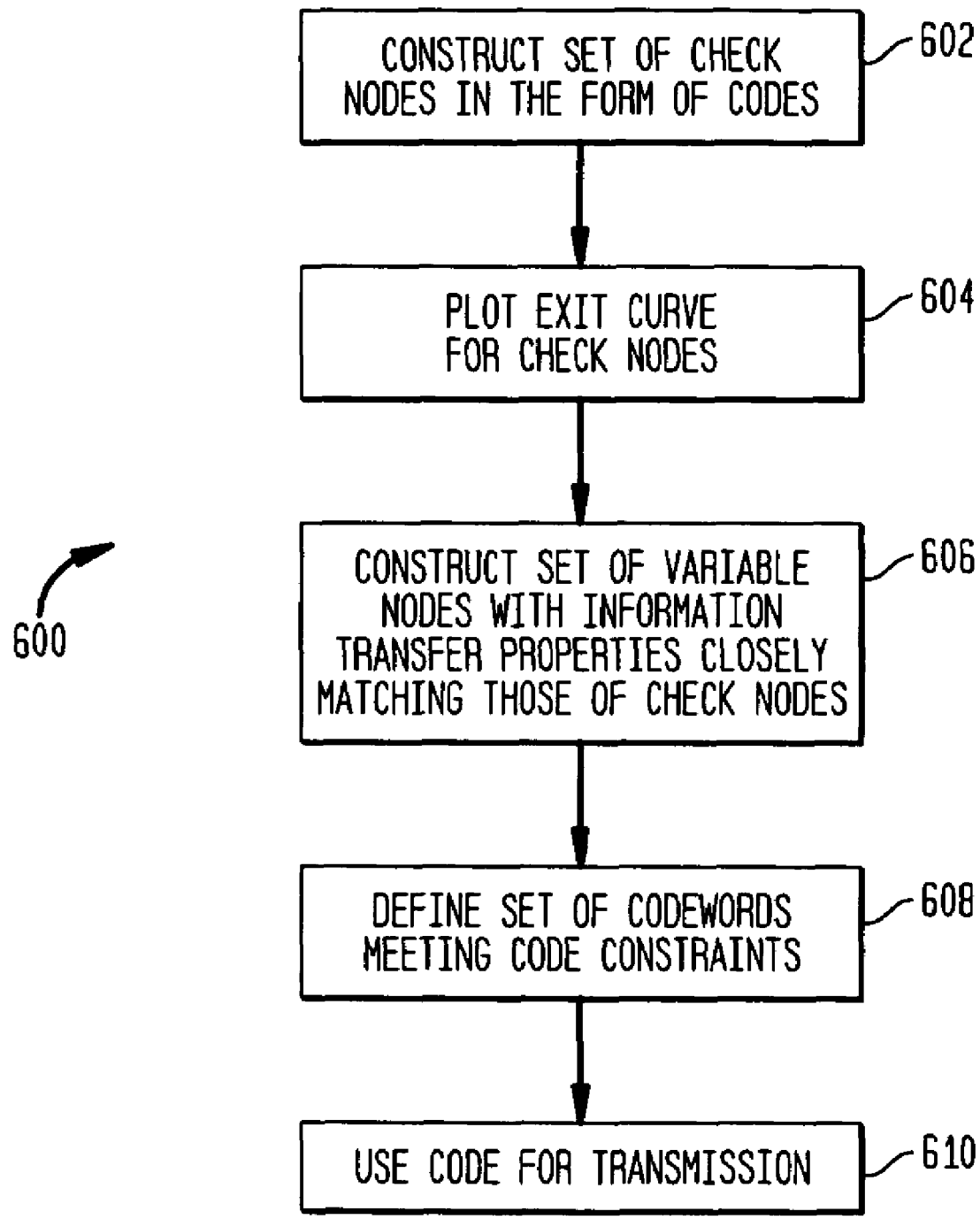

METHODS AND APPARATUS FOR COMMUNICATION USING GENERALIZED LOW DENSITY PARITY CHECK CODES

FIELD OF THE INVENTION

The present invention relates generally to improved systems and methods for design of codes and their use in communication. More particularly, the invention relates to advantageous techniques and systems for creation and use of low density parity check codes that provide a near capacity code rate combined with an assurance of successful decoding to convergence.

BACKGROUND OF THE INVENTION

Many media, such as wireless telephony, optical data transmission and the like accomplish communication by sending and receiving of binary digits, or bits, over a communication channel. Almost every communication channel introduces impediments to transmission, such as noise or extraneous signals, so that it is very difficult or impossible to be certain of the identity of any particular bit, that is, whether a bit is a binary 0 or a binary 1. Therefore, communication is frequently accomplished through the use of binary codes. Many binary codes provide error control, allowing for detection of errors in transmission or for correction of the errors. A coding arrangement imposes constraints on bit sequences that are introduced to the transmission side of a channel, such that the bit sequence received at the receiving side of a channel will follow some known criterion. If the bits at the receiving side of the channel do not follow the specified criterion, it is known that an error occurred during transmission, and it is also frequently possible to identify and correct the specific error. Transmissions often take the form of codewords, where a codeword is a sequence of bits following a criterion imposed by a coding arrangement.

One particularly useful error correcting code is a low density parity check (LDPC) code. Such a code is conveniently represented by a bipartite graph having a set of n "variable" nodes and a set of (n–k) "check" nodes, where n is the total number of bits in a codeword to be transmitted and k is the number of information bits in the codeword. A set of edges connects variable nodes to check nodes. The connectivity of the graph defines a particular LDPC code. To determine whether a binary vector of length n is a valid codeword, the vector is placed into 1:1 correspondence with the variable nodes. At the check nodes, the bits are summed as determined by the edges of the graph. The vector is a codeword if and only if the modulo 2 sum of the bits at each check node is 0. For example, a check node "C" may be connected to two variable nodes "A" and "B". A binary vector "01" is tested by placing the bit "0" into correspondence with the node "A" and the bit "1" into correspondence with the node "B." The node "C" is connected to the nodes "A" and "B", and therefore the bits "0" and "1" are summed to determine if the vector "01" is a valid codeword. In this case, the modulo 2 sum of the bits is "1," so the codeword is invalid.

In order to decode an LDPC code, the decoder passes a posteriori probabilities of the two possible values of each input node to the check nodes. At the check nodes, the parity condition is used to calculate new a posteriori probabilities, which are passed back to the variable nodes. This process iterates to convergence.

An LDPC code is most useful if its rate is high, the codeword length n is relatively short, the minimum distance, which relates to distinguishability between codewords when noise is present, is relatively high and the time required to converge is relatively short. However, it is difficult or impossible to design a code that achieves all four of these conditions at the same time, so that code designs typically seek to strike a balance between the conditions, while insuring that the code provides acceptable performance. In particular, it is essential that a code be designed so that convergence can proceed successfully. Some faulty designs exist that will prevent convergence, so that decoding is impossible. The design of a code prevents convergence when values associated with selected information transfer properties of the check nodes at any point during the convergence process exceed those of the variable nodes at any point. Such a condition can be identified by examining an extrinsic information transfer function chart, or EXIT chart. An EXIT chart predicts the behavior of a code, and plots the information transfer characteristics of the code for both the variable nodes and the check nodes of the code. If the code is such that the plot for the check nodes lies above the plot for the variable nodes at any point on the chart, decoding to convergence is impossible. On the other hand, the area enclosed between the plot for the check nodes and the plot for the variable nodes indicates the code rate, so that ideally codes should be designed such that the two plots lie as close together as possible. However, the closer together the plots lie, the more difficult it is to insure that the check node plot never crosses the variable node plot.

For conventional LDPC codes, achieving near channel capacity may often require relatively long codes or many iterations in decoding, as compared to codes that could be developed more freely so as to yield desired characteristics.

There exists, therefore, a need for systems and techniques for designing codes that allow flexibility in design and that allow for a relatively high code rate and insure proper convergence.

SUMMARY OF THE INVENTION

A wireless communication system according to one aspect of the present invention includes a plurality of transceivers for conducting communication using binary data transmissions. Each binary transmission is encoded and decoded using an LDPC code designed using the techniques of the present invention. Each transceiver includes a transmitter which transmits data in the form of an encoded bit stream. The bit stream is encoded using an LDPC code having a design rate near the capacity of the channel over which communication is conducted. The LDPC code comprises a set of codewords that produce valid results when submitted to a validator comprising a set of variable nodes and a set of check nodes, with outputs of the variable nodes being connected to inputs of the check nodes by interleaver edges. Each check node is in the form of a code, with the output of a check node being valid if its inputs form a valid codeword. Each variable node is likewise in the form of a code whose outputs are valid if its inputs are valid codewords of the code. The validator may suitably be constructed by plotting information transfer properties of the check nodes using an extrinsic information transfer function (EXIT) chart to form a check node curve and matching a variable node curve to the check node curve, insuring that the variable node curve lies above the check node curve but as close to it as possible, and that the variable node curve closely follows the check node curve. The variable nodes are then constructed so as to provide the information transfer properties indicated by the variable node curve, and the code defined by the validator is used to encode data for transmission.

A more complete understanding of the present invention, as well as further features and advantages, will be apparent from the following Detailed Description and the accompanying drawings.

BRIEF DESCRIPTION OF THE DRAWINGS

FIG. 6 illustrates a process of code design and data communication according to an aspect of the present invention.

DETAILED DESCRIPTION

The present invention will be described more fully hereinafter with reference to the accompanying drawings, in which several presently preferred embodiments of the invention are shown. This invention may, however, be embodied in various forms and should not be construed as limited to the embodiments set forth herein. Rather, these embodiments are provided so that this disclosure will be thorough and complete, and will fully convey the scope of the invention to those skilled in the art.

Figure 1:
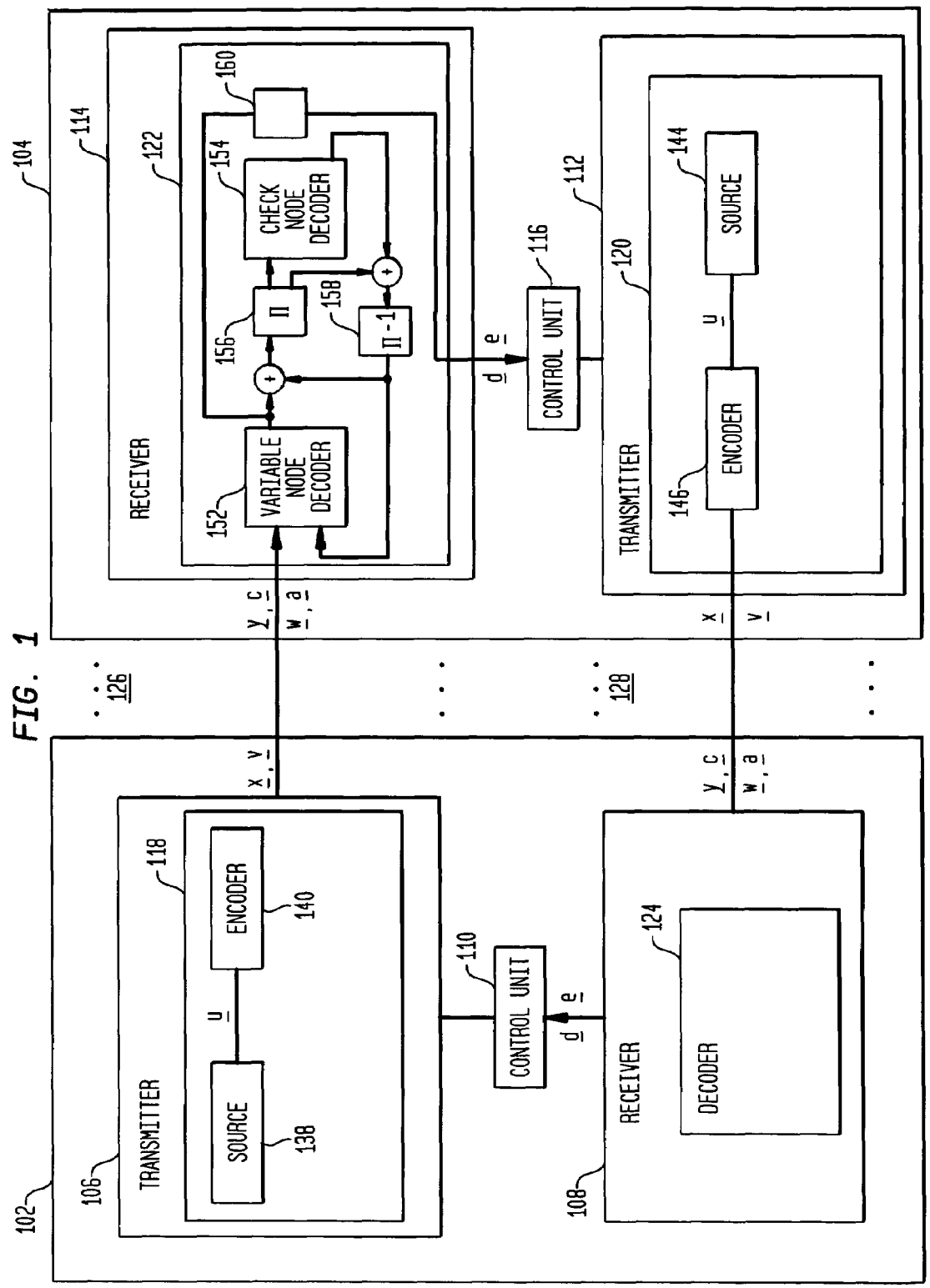
FIG. 1 illustrates a data communication system employing encoders and decoders operating according to an aspect of the present invention.

FIG. 1 illustrates a wireless communication system 100 according to an aspect of the present invention. The system 100 includes a base station 102 and a mobile unit 104, with the base station including a transmitter 106, a receiver 108 and a control unit 110, and with the mobile unit including a transmitter 112, a receiver 114 and a control unit 116. The transmitters 106 and 112 include encoders 118 and 120, respectively, and the receivers 108 and 116 include decoders 122 and 124, respectively. The transmitter 106 transmits to the receiver 114 across a channel 126 and the transmitter 112 transmits to the receiver 108 across a channel 128. The channels 126 and 128 are discussed here as binary erasure channels, in order to provide explicit mathematical descriptions of various properties of interest. However, it will be recognized that a system such as the system 100 may be designed so as to communicate across any of a number of alternative types of communication channels, for example those commonly found in wireless communication.

The encoder 106 and the decoder 122 will be discussed in additional detail here, and it will be noted that the encoder 120 and the decoder 124 operate in an identical manner. A source 138 is a binary symmetric source producing a vector u of k independent information bits, each taking on the values 0 and 1 with probability ½. An encoder 140 maps $\underline{u}$ to a binary length n codeword $\underline{x}$, and maps u to a binary m length codeword $\underline{v}$. The encoder 120 includes a source 144 and an encoder 146, operating in the same way as the corresponding components of the encoder 118, but the encoder 120 and the decoder 124 will not be discussed in detail here, in order to avoid unnecessary repetition. The decoder 122 includes component decoders 152 and 154, interleavers 156 and 158 and a hard decision unit 160.

The system 100 suitably employs LDPC codes designed according to the teachings of the present invention. The LDPC codes of the present invention have information transfer characteristics that provide for a high code rate while assuring that decoding can be accomplished successfully, and can be designed so as to achieve desired information transfer characteristics.

Figure 2:
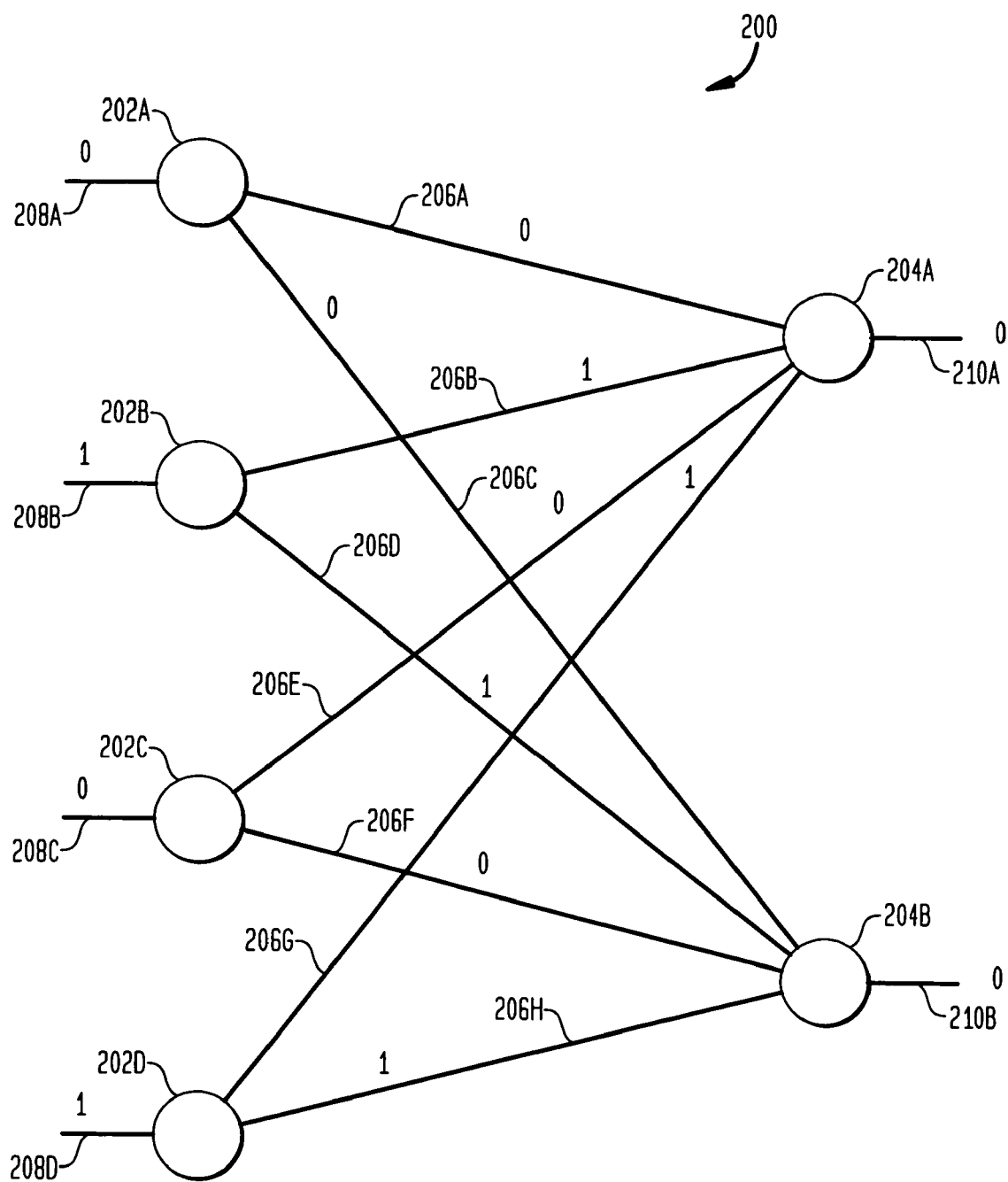
FIG. 2 illustrates a graphic representation of a prior art LDPC code.

FIG. 2 illustrates a graph 200 showing the principles of a prior art LDPC code. The graph 200 includes four variable nodes 202A-202D and two check nodes 204A and 204B. The variable nodes 202A-202D are connected to the check nodes 204A and 204B by the edges 206A-206F. The variable nodes 202A-202D receive the inputs 208A-208D, respectively, and the check nodes 204A and 204B produce the outputs 210A and 210B, respectively. The design of the code represented by the graph 200 is determined by the connectivity between the variable nodes 202A-202D and the check nodes 204A and 204D, with the connectivity being indicated by the edges 206A-206H.

The codewords for the code represented by the graph 200 are 4-bit strings. A codeword is valid only if the presentation of each bit in the codeword to a corresponding one of the inputs 208A-208D and produces a valid output at the outputs 210A and 210B. In order for a codeword to be valid, the output at each of the check nodes 204A and 204B, that is, the outputs 210A and 210B, must be 0. The output of each of the check nodes 204A and 204B is the modulo 2 sum of the inputs at that check node. The inputs to a check node are the input bits of the variable nodes connected to that check node. For example, the inputs to the check node 204A are 0, 1, 0 and 1, because these are the inputs to the variable nodes 202A, 202B, 202C and 202D. The output of the check node 204A is 0, because the modulo 2 sum of 0, 1, 0 and 1 is 0. The inputs to the check node 204B are 0, 1, 0 and 1 and the output of the check node 104B is 0. The binary string 0101 is a valid codeword because it produces a 0 at each of the outputs 212A and 212B. The binary string 1000, on the other hand, is not a valid codeword because it produces a 1 at the outputs 212A and 212B.

Decoding of an LDPC code is performed iteratively, and a proposed code must meet particular criteria in order to be valid. In addition, the code rate of a code depends on specific properties of the code and the relationship of the properties exhibited by the variable nodes and the check nodes. The information transfer characteristics of a prior art LDPC code such as that illustrated by the graph 200 of FIG. 2 imposes constraints on the design of the code which must be met in order to insure the successful decoding of the code and to achieve a code rate approaching the capacity of the channel. Information transfer characteristics of a prior art LDPC code will be discussed in detail in connection with FIG. 4, which presents an extrinsic information transfer function chart, or EXIT chart, which presents the information transfer properties of a code in visual form and analysis of which can reveal significant properties of the code. The discussion of FIG. 4 follows preliminary background information describing the operation of encoders and decoders using this and similar codes and various properties of the codes and the encoding and decoding process.

Figure 3:
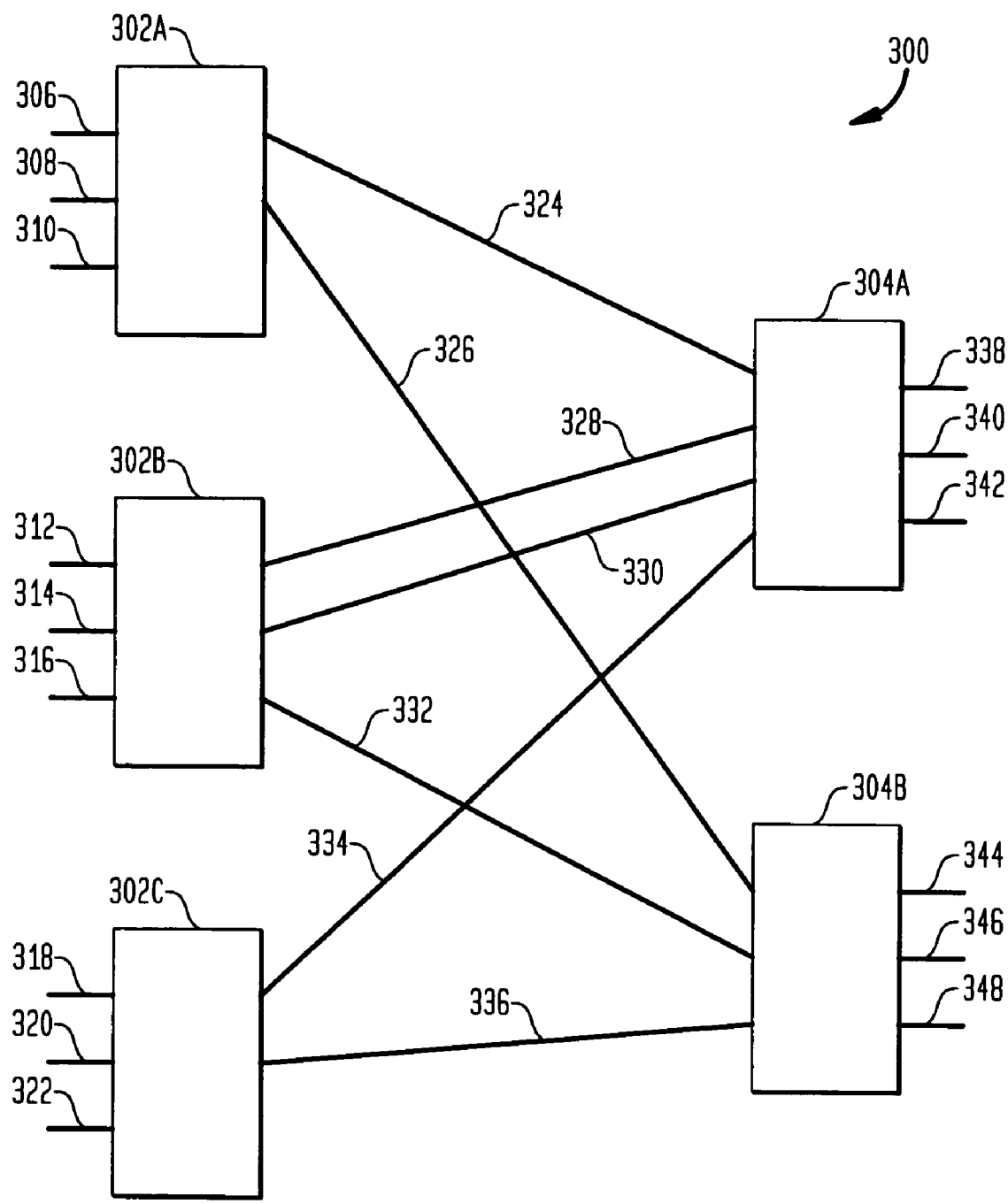
FIG. 3 illustrates a graphic representation of an LDPC code employing the principles of the present invention.

FIG. 3 illustrates a graph 300 illustrating a coding arrangement according to an aspect of the present invention. Such a coding arrangement may conveniently be referred to as a generalized LDPC code. The system 300 of FIG. 3 suitably employs a generalized LDPC code for data transmission. A generalized LDPC code is similar to a conventional LDPC code such as that illustrated by the graph 200 of FIG. 2, but a generalized LDPC code has codes at the variable nodes and check nodes, rather than single bits. Therefore, a codeword of a generalized LDPC code is valid when it generates a valid output at each of the check nodes, as well as a valid output at each of the variable nodes. By contrast, a codeword of a conventional LDPC code is valid only when it generates a 0 at each of the check nodes.

The graph 300 includes 3 variable nodes 302A-302C and 2 check nodes 304A and 304B. The variable nodes 302A has inputs 306-310, the variable node 302B has inputs 312-316 and the variable node 302C has inputs 318-322. The check nodes 304A and 304B have inputs represented by the edges 324-336. The check node 304A has outputs 338-342 and the check node 304B has outputs 344-348. The generalized LDPC code represented by the graph 300 allows all codewords represented by the inputs 306-322, such that these inputs produce valid outputs at the outputs 344-348. The variable nodes 302A-302D and the check nodes 304A and 304B may be thought of as analogous to encoders operating according to selected coding arrangements. The coding arrangements for the variable nodes 302A-302D and the check nodes 304A and 304B are selected so as to provide desired information transfer characteristics for the coding arrangement represented by the graph 300. For a graph such as the graph 300, proper selection of coding arrangements for the variable nodes, and the check nodes and proper selection of the interleaver edges define the overall coding arrangement represented by the graph, and can be chosen such that a near capacity code rate can be achieved while providing assurance that decoding can proceed to convergence.

Specific details of the selection of the properties of the variable nodes 302A-302D and the check nodes 304A and 304B will be presented below following background information relating to information transfer properties of a coding arrangement and the use of EXIT charts in understanding these characteristics.

EXIT charts may advantageously be used to identify properties of particular coding arrangements, and EXIT charts are useful in designing coding arrangements that will provide desired properties. In particular, particularly desirable properties of coding arrangements can be perceived using EXIT charts, and these charts can be used to design the particular details of coding arrangements employing the teachings of the present invention.

Returning now to the system 100 of FIG. 1, the decoder 122 receives two vectors, which are a noisy version $\underline{y}$ of $\underline{x}$ and a priori information $\underline{w}$ about the bits $\underline{v}$ on the graph edges. The a priori information $\underline{w}$ can be modeled as noisy versions of $\underline{v}$. The decoder 122 uses $\underline{y}$ and $\underline{w}$ to compute two estimates of $\underline{v}$. These are the a posteriori L-values $\underline{d}$ and the extrinsic L-values $\underline{e}$. The symbol $w_i$ gives a priori information about the random variable $V_i$ with L-value $$a_i = \log \frac{P(w_i \mid V_i = 0)}{P(w_i \mid V_i = 1)}. \quad (1)$$

where $P(w_i \mid V_i = 0)$ is the probability that $W_i = w_i$ conditioned on the event $V_i = 0$. Similarly, the symbol $y_j$ gives information about the random variable $V_i$ with L-value $$c_i = \log \frac{P(y_j \mid X_j = 0)}{P(y_j \mid X_j = 1)}. \quad (2)$$

For simplicity, it can be assumed that all random variables are discrete. Continuous random variables are treated by replacing certain probabilities by probability density functions. One decoder of particular interest is an APP bit decoder that computes the L-values $$d_i = \log \frac{Pr(V_i = 0 \mid \underline{y}, \underline{w})}{Pr(V_i = 1 \mid \underline{y}, \underline{w})} \quad (3)$$

where $Pr(V_i = 0 \mid \underline{y}, \underline{w})$ is the probability of the event $V_i = 0$ conditioned on $\underline{Y} = \underline{y}$ and $\underline{W} = \underline{w}$.

For further analysis, $\underline{v}_{[i]}$ may be used to represent the vector $\underline{v}$ with the ith term removed, that is, $\underline{v}_{[i]} = [v_1, \ldots, v_{i-1}, v_{i+1}, \ldots, v_m]$. The numerator in equation (3) can be expanded as $$Pr(V_i = 0 \mid \underline{y}, \underline{w}) = \sum_{\underline{u}: v_i(\underline{u}) = 0} P(\underline{u} \mid \underline{y}, \underline{w}) \quad (4)$$

$$= \sum_{\underline{u}: v_i(\underline{u}) = 0} \frac{P(\underline{u}) P(\underline{w} \mid \underline{u}) P(\underline{y} \mid \underline{u}, \underline{w})}{P(\underline{y}, \underline{w})}$$

$$= \sum_{\underline{u}: v_i(\underline{u}) = 0} \frac{P(\underline{u}) P(\underline{w} \mid \underline{v}(\underline{u})) P(\underline{y} \mid \underline{x}(\underline{u}))}{P(\underline{y}, \underline{w})}$$

$$= \frac{P(w_i \mid V_i = 0)}{P(\underline{y}, \underline{w})} \sum_{\underline{u}: v_i(\underline{u}) = 0} P(\underline{u}) P(\underline{w}_{[i]} v_{[i]}(\underline{u})) P(\underline{y} \mid \underline{x}(\underline{u})),$$

where $\underline{v}(\underline{u})$ and $\underline{x}(\underline{u})$ are vectors corresponding to u, and where the last step follows because the extrinsic channel is memoryless. Expanding the denominator of equation (3) in the same way and inserting the result into equation (3) yields $$d_i = a_i + e_i, \text{ where} \quad (5)$$

$$e_i = \log \frac{Pr(V_i = 0 \mid \underline{y}, \underline{w}_{[i]})}{Pr(V_i = 1 \mid \underline{y}, \underline{w}_{[i]})} \quad (6)$$

$$= \log \frac{\sum_{\underline{u}: v_i(\underline{u}) = 0} P(\underline{w}_{[i]} v_{[i]}(\underline{u})) P(\underline{y} \mid \underline{x}(\underline{u}))}{\sum_{\underline{u}: v_i(\underline{u}) = 1} P(\underline{u}) P(\underline{w}_{[i]} v_{[i]}(\underline{u})) P(\underline{y} \mid \underline{x}(\underline{u}))}.$$

The number $e_i$ is called the extrinsic L-value about $v_i$, and may be considered a realization of the random variable $E_i$.

An iterative decoder, such as the decoder 122, has two or more component decoders, such as the component decoders 152 and 154, that pass extrinsic L-values to one another. More precisely, the values of $e_i$ from one decoder pass through an interleaver and are fed to another decoder as a priori L-values $\underline{a}$. For example, the values of $e_i$ pass from the decoder 150 through the interleaver 156, to the decoder 154, and the values of $e_i$ pass from the decoder 154 through the interleaver 158, to the decoder 150.

It is convenient to model $\underline{a}$ as being output from a channel. Two quantities may be modeled as being generated by the decoders 150 and 152, as follows:

$$I_A := \frac{1}{m}\sum_{i=1}^{m} I(V_i; A_i) \quad (7)$$

$$I_E := \frac{1}{m}\sum_{i=1}^{m} I(V_i; E_i) \quad (8)$$

The value $I_A$ is called the average a priori information going into the encoder, and the value $I_E$ is called the average extrinsic information coming out of the decoder. An EXIT chart plots $I_E$ as a function of $I_A$. The EXIT chart can be interpreted as depicting how a decoder simplifies or suppresses the knowledge about the values of $v_i$ as measured from the decoder inputs $a_i$ to the decoder outputs $e_i$.

If it is assumed that the values of $V_i$ all have the same distribution and the extrinsic channel is memoryless and time invariant, the value of $I_A$ can be expressed as follows:

$$I_A = I(V_i; A_i) \quad (9)$$

Because $V_i$ is binary, $0 \leq I_A \leq 1$. Codes most suitable for use with a system such as the system 200 are those for which the values of $V_i$ are uniform and identically distributed, and extrinsic channels for which $I_A$ can take on all values between 0 and 1.

Next, an expression for $I_E$ can be generated. $E_i$ is a function of $Y$ and $\underline{W}_{[i]}$, and $\underline{W}_{[i]}$ and $A_{[i]}$ are interchangeable because one defines the other. The combination of these two propositions means that the following expression is true:

$$I_A = I(V_i; e_i) \leq I(Y_i; \underline{W}_{[i]}) = I_A = I(Y; A_{[i]}) \quad (10)$$

For APP decoders, the inequality in equation (10) is an equality.

It is convenient to use only one of the expressions $A_i$ and $W_i$ because they are interchangeable, so making an arbitrary choice to use $A_i$ yields the following proposition:

$$I(V_i; A_i) = I(\underline{Y}; A_{[i]}) \quad (11)$$

Using this proposition yields the following expression for $I_E$:

$$I_E := \frac{1}{m}\sum_{i=1}^{m} I(V_i; YA_{[i]}) \quad (12)$$

The advantage of using the expression of equation (12) is that the only random variables that need to be considered are those in front of the decoder 222.

Of particular interest in connection with the present invention are expressions for $I_E$ for variable nodes and check nodes for LDPC codes.

Suppose the communication channel 126 is a binary erasure channel with erasure probability q and $w_i$ is modeled as being the output of a binary erasure channel with erasure probability p. In that case, $I_E$ for LDPC variable nodes of degree $d_v$ can be computed as follows:

$$I_E = 1 - qp^{d_v-1}, \quad (13)$$

or $$I_E = 1 - q(1 - I_A)^{d_v-1}.$$

If $\underline{u}$ has k bits and the encoder 140 is a length $d_v = k+1$ single parity check code, the following expression can be used for the value of $I_E$:

$$I_E = \frac{d_v - 1}{d_v}[(1-q) + q(1-p)(1-qp)^{d_v-2}] + \frac{1}{d_v}(1-qp)^{d_v-1} \quad (14)$$

For an LDPC check node of degree $d_c$, the encoder 118 may be implemented with $\underline{y} = 0$ and with the encoder 140 being a length $d_c$ single parity check code. For an LDPC code of degree $d_c$, $I_E$ can be computed as follows:

$$I_E = (1-p)^{d_c-1} \quad (15)$$

Figure 4:
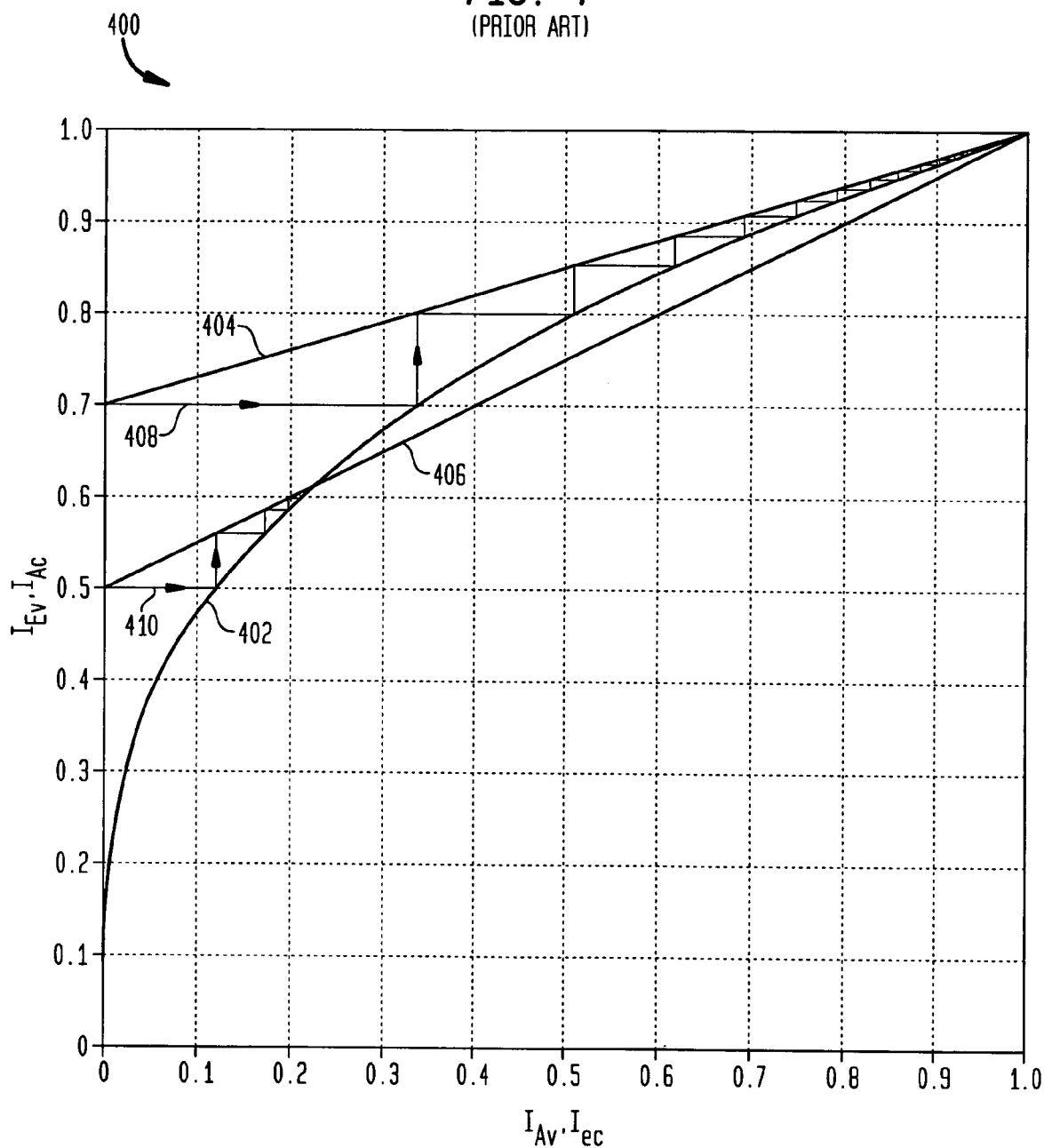
FIG. 4 illustrates an EXIT chart representing the behavior of a conventional LDPC code.

FIG. 4 illustrates an extrinsic information chart 400, illustrating characteristics of a code defined by a graph such as the graph 200. The chart 400 plots the information content at the check nodes of the code against the information content at the variable nodes of the code. The curve 402 plots $I_{Av}, I_{Ec}$ against $I_{Ev}, I_{Ac}$ for the check nodes and the curves 404 and 406 plot $I_{Av}, I_{Ec}$ against $I_{Ev}, I_{Ac}$ for the variable nodes for q=0.3 and q=0.5, respectively. Specifically, the curve 402 plots the equation $(I_E)I_A = I_A^{d_c-1}$, with $d_c = 4$ and the curves 404 and 406 plot equation (13), which can also be expressed as $(I_E) = (1-q)(1-I_A)^{d_v-1}$, with $d_c = 2$ and with q taking on the value 0.3 for the curve 404 and the value 0.5 for the curve 406. The relationships between the curves 402 and the curves 404 and 406 provide important information about the coding rates of codes illustrated by the curves.

As will be explained in greater detail below, the rate of a code illustrated by an EXIT chart depends on the area enclosed between the curve representing the variable nodes and the curve representing the check nodes. The smaller the area enclosed between the variable node curve and the check node curve, the higher the code rate and the greater the area enclosed between the variable node curve and the check node curve, the lower the code rate, but the faster the decoding. In order to achieve a high code rate, it is desirable to design codes that with information transfer properties such that the variable node curve is as close as possible to the check node curve. At the same time, it is critical that the check node curve lie entirely beneath the variable node curve. If the check node curve intersects or is above the variable node curve at any point, decoding will not proceed to convergence.

These considerations become apparent upon consideration of the curves 402, 404 and 406 of FIG. 4. The decoding trajectories for a code such as that represented by the graph 200 of FIG. 2 are shown by the curves 408 and 410 for erasure probabilities q=0.3 and q=0.5, respectively. It can be seen that the decoding trajectory curve 408 begins at 0.7, moves rightward to intercept the check node curve 402, moves upward to intercept the variable node curve 404, rightward to intercept the check node curve 402, and so on. The decoding trajectory curve converges to an erasure probability of 0. There is therefore an open convergence tunnel between the curves 402 and 404, allowing successful decoding in a channel with an erasure probability of q=0.3 or less.

The decoding trajectory curve 410, however, begins at 0.5, moves rightward to intercept the curve 402, upward to intercept the curve 406, and continues only until the curve 406 crosses the curve 402. Decoding cannot continue past the interception point.

Examination of the graph 400 suggests that the area enclosed between a variable node curve and a check node curve indicates the rate of a code, with decoding becoming faster as the distance between the variable node curve and the check node curve increases.

For an LDPC code, the area under an EXIT curve can be used to determine the rate of the code represented by the curve. It will be observed that $$I_A = I_{A,max} \cdot (1-p) \quad (16)$$

where $$I_{A,max} = \frac{1}{m}\sum_{i=1}^{m} H(V_i) \quad (17)$$

is the maximum possible value of $I_A$. The area under the EXIT function may be expressed by:

$$\text{Area} = \int_0^{I_{A,max}} I_E(I_A) dI_A, \quad (18)$$

For binary erasure channels, and for any codes and any communication channel, it can be proven that $$\text{Area} = I_{A,max}^2 \left[1 - \frac{H(\underline{V}\mid\underline{Y})}{\sum_{i=1}^{m} H(V_i)}\right]. \quad (19)$$

It will be observed that $0 \leq H(\underline{V}\mid\underline{Y}) \leq H(\underline{V}) \leq \sum_{i=1}^m H(V_i)$, which implies that $0 \leq \text{Area} \leq I_{A,max}^2 \leq 1$.

A number of observations can be made from this result. For example, if an encoder such as the encoder 140 is linear and has no idle components, that is, the generator matrix of the encoder has no all zeros column, that means that $H(V_i)=1$ for all I so that equation (19) simplifies to $$\text{Area} = 1 - \frac{1}{m} H(\underline{V}\mid\underline{Y}). \quad (20)$$

Furthermore, if both encoders 140 and 142 are one to one, that is, invertible, mappings, then $\underline{U}$, $\underline{V}$ and $\underline{X}$ can be interchanged. For example, equation 20 is equivalent to:

$$\text{Area} = 1 - \frac{1}{m} H(\underline{X}\mid\underline{Y}). \quad (21)$$

The rate of a code may be given by either of the expressions $R=k/n$ or $R=H(\underline{V})/n$, which yields the equivalence $H(\underline{V})=k$.

To take specific examples of the computation of area for classes of LDPC variable and check node curves, for the example characterized by equation (13) and illustrated by the curves 404 and 406, the area under the variable node curves is given as follows:

$$\text{Area} = 1 - \frac{1 - I(X_1; Y_1)}{d_v} \quad (22)$$

For the check nodes characterized by equation (15) and illustrated by the check node curve 402, the area under the check node curve is given as follows:

$$\text{Area} = \frac{1}{d_c} \quad (23)$$

The rate of an LDPC code is computed as follows. First, it will be observed that the design rate R of an LDPC code is determined by the number of variable nodes $n_v$ and the number of check nodes $n_c$, according to the following computation:

$$R = \frac{(n_v - n_c)}{n_v} = 1 - \frac{n_c}{n_v} \quad (24)$$

It will be noted that $n_v$, the number of variable nodes, is the code length n. If $\overline{d_v}$ and $\overline{d_c}$ are the average degrees of the variable and check nodes, the number of interleaver edges is both $n_v \overline{d_v}$ and $n_c \overline{d_c}$, so that the rate R can be expressed as follows:

$$R = 1 - \frac{\overline{d_v}}{\overline{d_c}} \quad (25)$$

If the capacity of the channel 126 is C, the areas under the respective variable and check node curves may be expressed as follows:

$$\text{Area}_v = \frac{1 - (1-C)}{\overline{d_v}} \quad (26)$$

$$\text{Area}_c = \frac{1}{\overline{d_c}} \quad (27)$$

For successful decoding, the variable node curve must be above the check node curve at all points. The implication of this requirement is that $1 - \text{Area}_v < \text{Area}_c$. Suppose that $1 - \text{Area}_v = \gamma \text{Area}_c$ for some value of $\gamma$ satisfying the inequality $0 \leq \gamma \leq 1$. Considering this proposition in light of equations (26) and (27) yields the expression $$R = \frac{C - (1-\gamma)}{\gamma}. \quad (28)$$

It will be noted that R<C.

It can be seen from equation (28) that an area gap between the variable node curve and the check node curve of a code translates into a rate loss compared to the channel capacity C. Therefore, in order to achieve a rate near channel capacity, it is necessary that the variable node curve be closely matched to the check node curve.

In order to obtain a desired check node curve and match the variable node curve to the check node curve, it is convenient to design a set of check nodes having desired information transfer properties, observing the EXIT function of the check nodes in order to achieve the desired properties, and to design a set of variable nodes having an EXIT function optimized to closely match that of the check nodes. The check nodes may be designed by choosing check nodes comprising one or more types of codes, such as Hamming codes, repeat codes, single parity check nodes or any other type or types of codes desired, with each node having a specified number of output edges chosen such that the overall code yields the desired information transfer characteristics. Each type of code has its own characteristic EXIT curve, and EXIT curves for a mixture of code types may be combined according to a weighting determined by the number of output edges for each code type. For example, if the check nodes comprise a mixture of Hamming codes having a total of 5 edges and single parity check codes having a total of 7 edges, the EXIT curve for the overall code will be determined by assigning a weight of 5/12 to the characteristic EXIT curve for Hamming codes and a weight of 7/12 to the characteristic EXIT curve for single parity check codes, and combining the curves. In order to design variable nodes characterized by an EXIT function matching the EXIT function of the check nodes, code types may be chosen for the variable nodes with a number of output edges for each code type, and the EXIT curves for each code type weighted by the number of edges assigned to each and combined, as described above with respect to check nodes. In order to obtain the desired EXIT characteristics, the code types and number of edges assigned to each may be adjusted in order to produce a variable node curve having desired characteristics. The two most important characteristics of a variable node curve are that it lie above the check node curve at all points and be as closely matched to the check node curve as possible.

Figure 5:
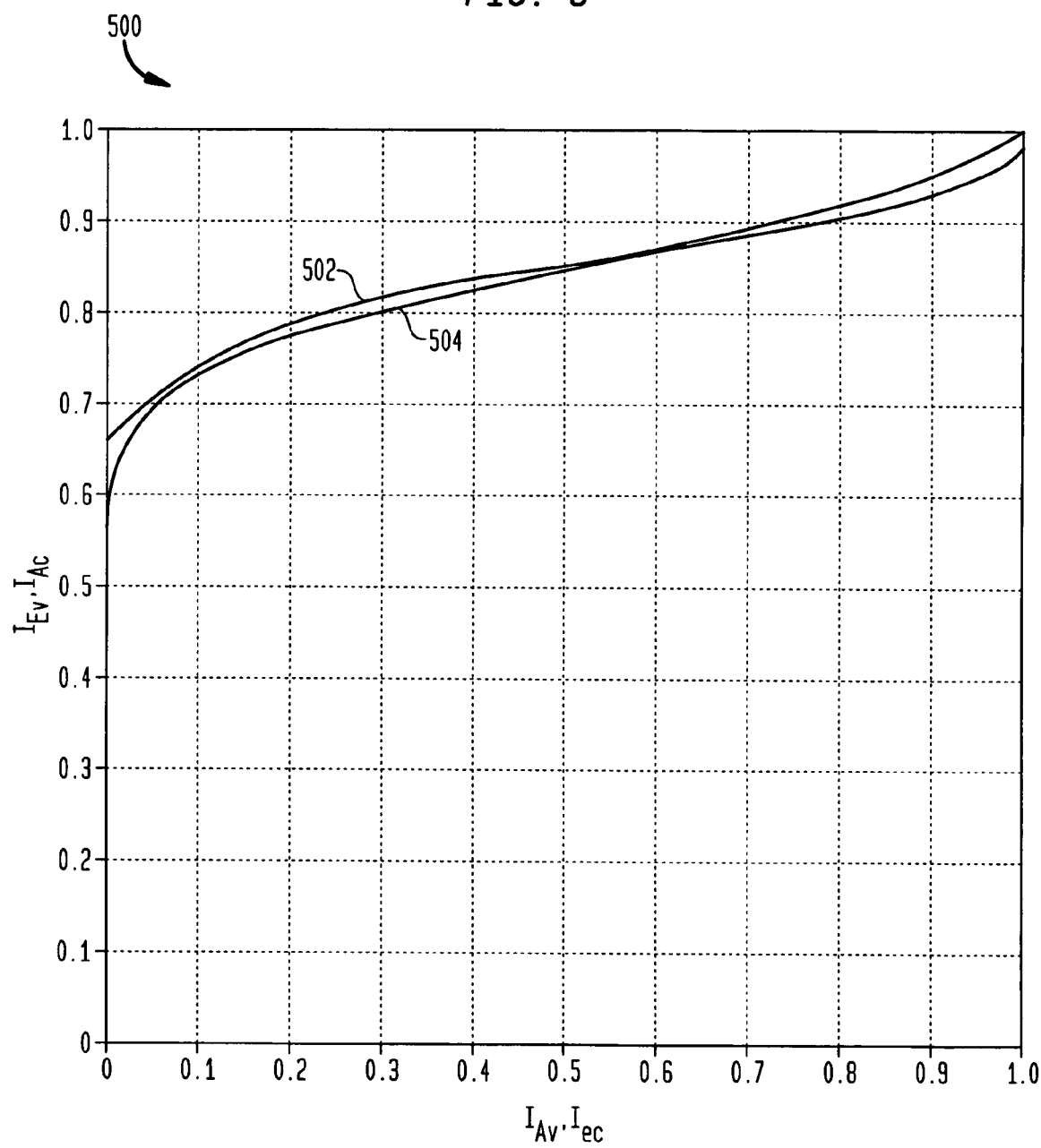
FIG. 5 illustrates an EXIT chart representing the behavior of a generalized LDPC code.

FIG. 5 illustrates a graph 500, showing a variable node curve 502 and a check node curve 504. The graph 500 shows the information transfer properties of a code such as the code illustrated by FIG. 3, wherein the check nodes and the variable nodes are codes, as described in connection with the discussion of FIG. 3. It will be remembered that the inputs to the variable nodes of the graph 300 of FIG. 3 are valid codewords for the codes comprising the variable nodes, and that the inputs to the check nodes of the graph 300 of FIG. 3 are valid codewords for the codes comprising the check nodes. The variable node curve 502 is above the check node curve 504 at all points, so that a convergence tunnel exists and decoding can continue to convergence. At the same time, the variable node curve 502 lies very close to the check node curve 504, so that the area difference between the two curves is very small, indicating a near capacity rate for the code.

The following discussion provides insight into characteristics of a generalized LDPC code providing the information transfer properties illustrated by a graph such as the graph 500. Suppose that a generalized LDPC code has $n_v$ variable nodes and $n_c$ check nodes, and the variable node j represents a $\lfloor d_{vj}, k_{vj} \rfloor$ linear code, with the $k_{vj}$ information bits going through the communication channel and the $d_{vj}$ coded bits going through the extrinsic channel. For example, consider the code described at the discussion of equation 13, that is, the case in which the variable nodes comprise LDPC variable nodes of degree $d_v$, the encoder 118 may be implemented with $\underline{u}$ being one bit, the equality $\underline{x}=\underline{u}$ is true, and the encoder 140 is a length $d_v$ repeat code. In that case, the variable nodes represent $\lfloor d_{vj}=d_v, k_{vj}=1 \rfloor$ repeat codes. The average number of coded bits and degrees per variable node is as follows:

$$\overline{k}_v = \frac{1}{n_v}\sum_{j=1}^{n_c} k_{vj}, \quad \overline{d}_v = \frac{1}{n_v}\sum_{j=1}^{n_c} d_{vj} \tag{29}$$

Suppose that check node j represents a $\lfloor d_{cj}, k_{cj} \rfloor$ linear code with no communication channel and with the $d_{vj}$ coded bits going through the extrinsic channel. This assumption yields the following result:

$$\overline{k}_c = \frac{1}{n_c}\sum_{j=1}^{n_c} k_{cj}, \quad \overline{d}_c = \frac{1}{n_c}\sum_{j=1}^{n_c} d_{cj} \tag{30}$$

The number of interleaver edges is both $n_v \overline{d}_v$ and $n_c \overline{d}_c$, and the number of constraints on the $n=n_v \overline{k}_v$ coded bits is $\Sigma_j(d_{cj}-k_{cj})$, which is equal to $\overline{d}_c - \overline{k}_c$. The design rate is therefore as follows:

$$R = \frac{\lfloor n - n_c(\overline{d}_c - \overline{k}_c) \rfloor}{n}, \text{ which is equal to:} \tag{31}$$

$$R = 1 - \frac{1-R_c}{R_v},$$

where $R_v = \frac{\overline{k}_v}{\overline{d}_v}$ and $R_c = \frac{\overline{k}_c}{\overline{d}_c}$.

The area under the EXIT curves 502 and 504, respectively, is as follows:

$$\text{Area}_v = 1-(1-C)R_v \tag{32}$$

$$\text{Area}_c = 1-R_c \tag{33}$$

Again, successful decoding requires that the property $1-\text{Area}_v < \text{Area}_c$ is true, so, as in the discussion of equation (28) above, it is possible to postulate $1-\text{Area}_v = \gamma \text{Area}_c$ for some value of $\gamma$ satisfying the inequality $0 \leq \gamma \leq 1$. Considering this proposition in light of equations (32) and (33) yields the expression (28), which is $$R = \frac{C-(1-\gamma)}{\gamma}.$$

In the specific case illustrated in the graph 500, the codes were developed using Hamming codes for the check nodes, with the check node curve 504 exhibiting the information transfer characteristics of Hamming codes.

For convenience in plotting an EXIT function for Hamming codes, it may be noted that a Hamming code is the dual of a simplex code. If a linear code Code is formed by all pairs $(\overline{v},\overline{x})$ to be passed to an extrinsic channel and a communication channel, $I_E^\perp(\bullet)$ can be used to represent the EXIT function of the dual code Code$^\perp$ of Code. That is, Code$^\perp$ is a [m+n, m+n−k] code. The following result is obtained:

$$I_E^\perp(p,q)=1-I_E(1-p,1-q) \tag{34}$$

If there is no communication channel, as is the case with check nodes, then the following result is obtained:

$$I_E^\perp(p,q)=1-I_E(1-p) \tag{35}$$

Equation (35) can be used to plot a curve such as the curve 502.

Once a curve such as the curve 504 has been plotted, it is then necessary to plot a variable node curve such as the curve 502. In the case illustrated by the curve 502, a mixture of variable nodes provided satisfactory information transfer characteristics. One half of the interleaver edges were connected to $d_v=8$ repeat codes, and the other half of the interleaver edges were connected to $d_v=7$ single parity check codes. 7/15 of the variable nodes were repeat codes and 8/15 were single parity check codes. The results $\bar{K}_v=55/15$ and $\bar{d}_v=112/15$ were obtained from equation (30), and it follows that $$R_v = \frac{55}{112}.$$

From equation (32), it follows that the design rate R is equal to $$\frac{229}{341} = 0.672,$$

which is close to C=0.7.

FIG. 6 illustrates a process 600 of constructing and using LDPC codes according to an aspect of the present invention. At step 602, a set of check nodes is constructed, the check nodes having the form of codes, for example Hamming codes. At step 604, information transfer properties of the check nodes are examined, for example by plotting an EXIT curve describing the information transfer properties of the check nodes. At step 606, a set of variable nodes is constructed having information transfer properties closely matching those of the check nodes, the variable nodes having the form of codes. The set of variable nodes may suitably be constructed by plotting a variable node curve matching a check node curve describing the properties of the check nodes and designing variable nodes following the check node curve, with interleaver edges placed so as to provide the information transfer properties described by the EXIT chart. At step 608, a set of codewords meeting the code constraints is defined. At step 610, the code is used for communication, for example by programming a communication system to map bits to the code and using the code to encode and decode transmissions.

While the present invention is disclosed in the context of a presently preferred embodiment, it will be recognized that a wide variety of implementations may be employed by persons of ordinary skill in the art consistent with the above discussion and the claims which follow below. For example, the above discussion has been primarily presented in the context of communication across a binary erasure channel. However, it will be recognized that the principles of the present invention may be applied to any number of communication channels. For example, using EXIT charts to gain insight into the properties of the check nodes and variable nodes of a code and to adjust the check nodes and variable nodes to achieve desired characteristics of the code is applicable for communication across any communication channel. In addition, and to take another example, choosing or adjusting code properties so as to insure that the variable node EXIT curve and the check node EXIT curve enclose the smallest reasonably possible area in order to achieve a code rate as high as reasonably possible is advantageous for many or all types of communication channels and not merely binary erasure channels.

We claim:

1. A transceiver for use in a communication system, comprising:
    a transmitter for transmitting binary data, the transmitter being operative to encode data using a generalized low density parity check (LDPC) code whose variable nodes and check nodes are codes and which is designed to provide for successful decoding to convergence at a code rate near the capacity of a channel over which communication occurs; and
    a receiver for receiving binary data transmitted using a generalized LDPC code, the receiver being operative to iteratively decode the data.

2. The transceiver of claim 1, wherein the generalized LDPC code is designed so as to closely match the information transfer properties of the variable nodes to those of the check nodes.

3. The transceiver of claim 2, wherein the generalized LDPC code is characterized by a variable node EXIT curve closely matched to and lying above a check node EXIT curve.

4. The transceiver of claim 3, wherein the generalized LDPC code is designed so that a relatively small area is enclosed between the variable node curve and the check node curve characterizing the code.

5. A transmitter for transmitting encoded binary data, comprising:
    a data source for communicating a stream of data bits for transmission; and
    an encoder for encoding the data bits, the encoder being operative to perform encoding according to a generalized LDPC code whose variable nodes and check nodes are codes and which is designed to provide for successful decoding to convergence at a code rate near the capacity of a channel over which communication occurs.

6. The transmitter of claim 5, wherein the generalized LDPC code is designed so as to closely match the information transfer properties of the variable nodes to those of the check nodes.

7. The transmitter of claim 6, wherein the generalized LDPC code is characterized by a variable node EXIT curve closely matched to and lying above a check node EXIT curve.

8. The transmitter of claim 7, wherein the generalized LDPC code is designed so that a relatively small area is enclosed between the variable node curve and the check node curve characterizing the code.

9. A method of code design for a generalized LDPC code, comprising the steps of:
    constructing a set of check nodes in the form of codes, the outputs of a check node being valid if the inputs to the check nodes are valid codewords of the code comprising the check node;
    analyzing the information transfer properties of the check nodes;
    designing a set of variable nodes having the form of codes, the outputs of a variable node being valid if the inputs to the variable node are valid codewords of the code comprising the variable node, the information transfer properties of the variable nodes being closely matched to those of the check nodes;
    connecting the variable nodes to the check nodes with a set of interleaver edges such that the generalized LDPC code provides a near capacity code rate and successful decoding to convergence; and defining a set of codewords meeting the constraints imposed by the generalized LDPC code.

10. The method of claim 9, wherein the step of analyzing the information transfer properties of the check nodes comprises plotting a check node EXIT curve reflecting the information transfer properties of the check nodes and the step of constructing the variable nodes comprises plotting a variable node EXIT curve reflecting the information transfer properties of the variable nodes and constructing variable nodes having the information transfer properties reflected by the variable node EXIT curve.

11. The method of claim 10, wherein the step of constructing the set of check nodes comprises forming an overall EXIT curve reflecting the combined properties of all types of check nodes in the set and repeatedly adjusting the properties of the check nodes and replotting the EXIT curve until the set of check nodes is characterized by an EXIT curve reflecting desired characteristics.

12. The method of claim 11, wherein the step of constructing the set of variable nodes includes choosing a set of variable node and connecting the variable nodes to the check nodes so as to produce desired characteristics for the set of variable nodes, plotting an overall EXIT curve reflecting the combined properties of all types of variable nodes in the set together with their connectivities and repeatedly adjusting the properties of the variable nodes and replotting the variable node EXIT curve until the set of variable nodes is characterized by an EXIT curve closely matched to the check node curve and otherwise reflecting desired characteristics for the variable nodes.

* * * * *